United States Patent [19]

Gugliotta et al.

[11] 4,264,202
[45] Apr. 28, 1981

[54] PIN RECEPTACLE INSPECTION APPARATUS AND METHOD

[75] Inventors: George Gugliotta, Ridgefield; Floyd W. Moir, II, Seymour; Edward M. Moros, Jr., New Milford, all of Conn.

[73] Assignee: Automation Systems, Inc., Brookfield, Conn.

[21] Appl. No.: 72,118

[22] Filed: Sep. 4, 1979

[51] Int. Cl.³ .................................. G01N 21/88
[52] U.S. Cl. .................................. 356/241; 250/562; 250/572
[58] Field of Search .................. 356/237, 241, 430; 250/562, 572

[56] References Cited

U.S. PATENT DOCUMENTS

| | | | |
|---|---|---|---|
| 3,316,411 | 4/1967 | Linderman | 250/562 X |
| 3,816,746 | 6/1974 | Gugliotta et al. | 356/241 X |
| 3,983,388 | 9/1976 | Gugliotta | 356/241 X |

Primary Examiner—Edward S. Bauer
Assistant Examiner—Matthew W. Koren
Attorney, Agent, or Firm—Martin Novack

[57] ABSTRACT

Apparatus and method are disclosed for inspecting a row of hollow pin receptacles in a housing to determine whether or not pins have been properly mounted in the receptacles. A collimated inspection light beam is directed toward one surface of the housing as it passes through an inspection position, so that the inspection beam successively impinges on the receptacles. A photodetector is disposed to face the opposing surface of the housing to receive light, if any, which has passed through the receptacles. Means responsive to the photodetector are provided for generating an output signal indicative of whether or not the pin has been properly mounted in the receptacle. The output signal generating means preferably comprises a threshold detector for detecting when the output of the photodetector exceeds a predetermined threshold. In the preferred embodiment of the invention, a collimated gating light beam is directed toward the inspection position so that a housing blocks the gating beam when a housing is at the inspection position. In this embodiment, a second photodetector is positioned to receive the gating beam when no housing is preset at the inspection position. Means responsive to the output of the second photodetector are provided for generating a gating signal that is used to gate the output signal generating means when a housing is present at the inspection position. A still further gating beam is used in conjunction with a third photodetector to determine when individual receptacles are at the inspection position.

22 Claims, 8 Drawing Figures

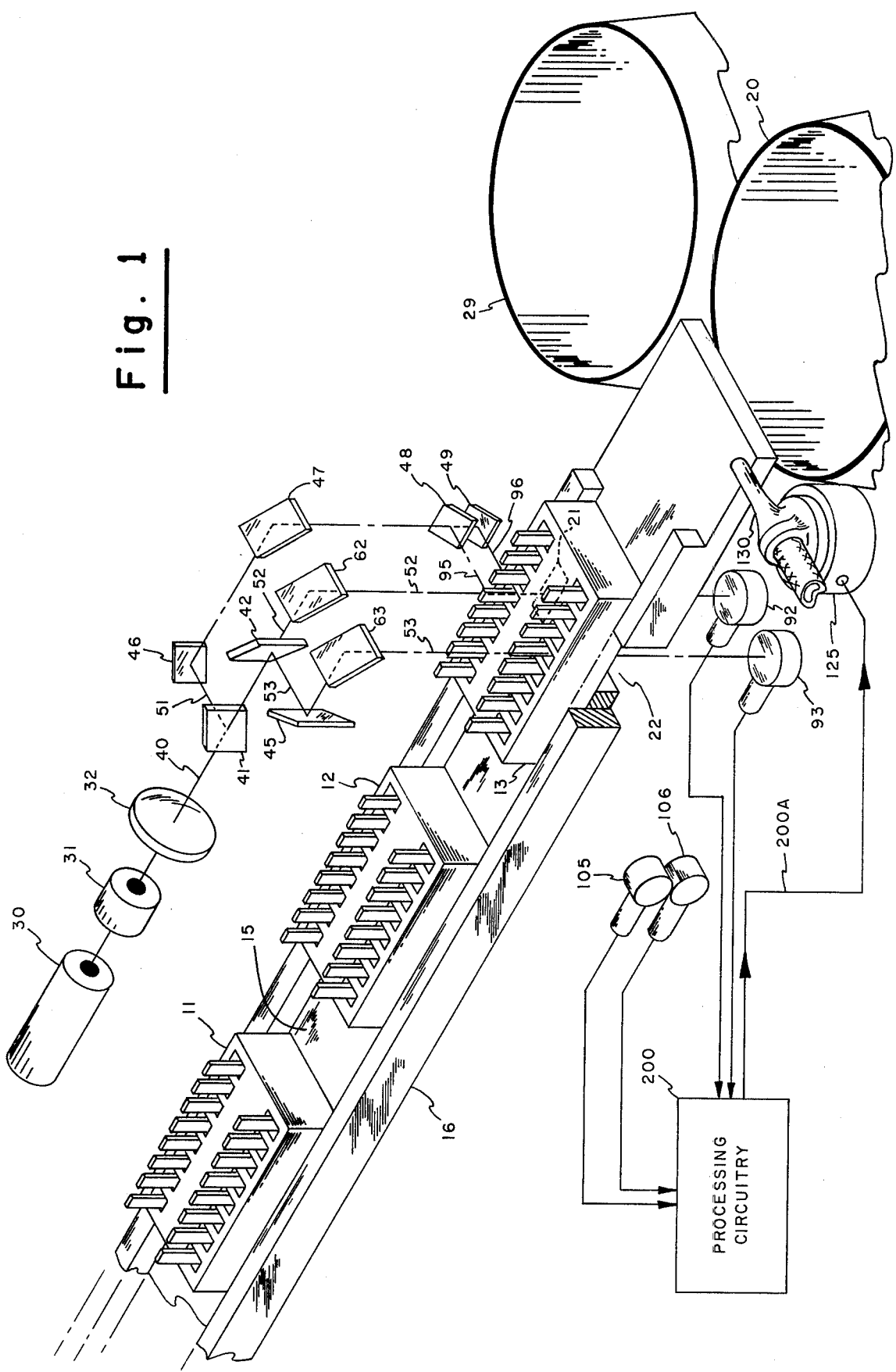

PIN RECEPTACLE INSPECTION APPARATUS AND METHOD

BACKGROUND OF THE INVENTION

This invention relates to inspection apparatus and, more particularly, to an apparatus for inspecting rows of hollow pin receptacles to determine if pins have been properly mounted in the receptacles.

Various applications exist where many small pins are mounted in pin receptacles of a housing, the pins typically being used to effect electrical connections to different terminal points. For example, an integrated circuit ("IC") may be mounted in a plug-in connection to a socket element which, in turn, has rows of pins that can be permanently connected to specified terminal points of the circuit in which the IC is to be employed. The IC plug-in module can then be readily plugged into the socket for efficient installation, and is easily removable for testing and maintenance. The socket elements typically include a housing having two parallel rows of hollow pin receptacles. A folded pin is mounted in each receptacle. Each such pin serves to both receive and contact a pin of the IC plug-in module from one end of the pin receptacle, and also to protrude from the other end of the pin receptacle and provide a conductor which can be connected, as desired, to circuit terminal points.

In mass producing IC sockets of the type described, one prevalent technique is to employ a machine which automatically inserts the pins into their respective receptacles, each pin having a folded-back leaf which is sprung into position in its receptacle. However, various defects are found to occur in this operation. For example, malfunctioning of the pin insertion machine or defective pins may result in a pin not being inserted in one or more receptacles of an IC socket. Accordingly, manual/visual inspection is generally used to determine whether the pin insertion operations have been properly performed. In addition to being costly from a labor standpoint, the IC sockets are relatively small and do not lend themselves well to human inspection. Also, another type of serious reject condition occurs which requires a closer manual/visual inspection to uncover; i.e., an improperly sprung ping which will not adequately contact the companion pin of an IC plug-in module which is mated with the IC socket. This condition may result, for example, from the folded portion of the pin being too far from the side wall of the receptacle. Manual/visual inspection therefore typically requires looking at the receptacles to determine if a gap is present next to any pin. In addition to the labor wasting aspects of this operation, human error can allow passage of defective IC sockets with serious performance consequences when the socket is later incorporated into a circuit.

It is an object of this invention to provide a reliable and labor-saving automatic inspection technique for determining whether or not pins have been properly inserted in pin receptacles, such as in IC socket housings.

SUMMARY OF THE INVENTION

The present invention is directed to an apparatus and method for inspecting a hollow pin receptacle in a housing to determine whether or not a pin has been properly mounted in the receptacle. In accordance with the apparatus of the invention, means are provided for directing a collimated inspection light beam toward one surface of the housing so that the beam impinges on the receptacle. Photodetector means are disposed to face the opposing surface of the housing to receive light, if any, which has passed through the receptacle. Means responsive to the photodetector means are provided for generating an output signal indicative of whether or not the pin has been properly mounted in the receptacle. The output signal generating means preferably comprises a threshold detector for detecting when the output of the photodetector means exceeds a predetermined threshold.

In a form of the invention, rows of hollow pin receptacles are inspected as they pass an inspection position. One or more inspection light beams are directed toward the rows of receptacles and successively impinge on each of the receptacles as the housing moves through the inspection position. In the preferred embodiment of this form of the invention, there is further provided a means for directing a collimated housing gating light beam toward the inspection position so that a housing blocks the housing gating beam when a housing is at the inspection position. In this embodiment, a second photodetector means is positioned to receive the housing gating beam when no housing is present at the inspection position. Means responsive to the output of the second photodetector means are provided for generating a housing gating signal, this signal being used to gate the output signal generating means when a housing is present at the inspection position.

In the inspection of IC sockets, the pins are normally mounted in housing receptacles such that the pins protrude from the housings. In the embodiment of the invention for inspecting this type of unit, means are provided for directing a collimated pin gating light beam at the inspection position. The pin gating beam is directed substantially parallel to the surface of the housings from which the pins protrude, such that the protruding portions of the pins successively block the pin gating beam as the inspection beam impinges on the receptacles of the pins blocking the pin gating beam. A third photodetector means is positioned to receive the pin gating beam when it is not blocked by the pins. Finally, means responsive to the third photodetector means are provided for generating a pin gating signal for gating the output signal generating means when a pin intercepts the pin gating beam.

Further features and advantages of the invention will become more readily apparent from the following detailed description when taken in conjunction with the accompanying drawings.

BRIEF DESCRIPTION OF THE DRAWINGS

FIG. 1 is a schematic diagram, partially in block form, of an embodiment of an inspecton apparatus in accordance with the invention and which can be used to practice the method of the invention.

DESCRIPTION OF THE PREFERRED EMBODIMENT

Figure 5:
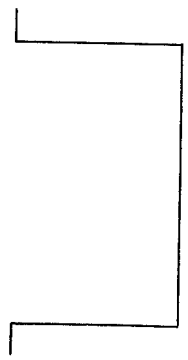
FIGS. 5, 6, 7 and 8 illustrate waveforms that are useful in understanding operation of the invention.

Referring to FIG. 1, there is shown an embodiment of an automatic inspection system in accordance with the invention. A number of IC sockets 11, 12 and 13 are illustrated as progressing down a track 15 of a ramp 16 toward a receiving chute 20. The sockets have their pins facing upward. The integrated circuit housings to be inspected may typically be either fed to the ramp directly from a machine used to insert pins into housing pin receptacles, or may be fed from a commercially available feeder (not shown) which employs a vibratory action to move the sockets to the ramp in an orderly fashion. A reject chute 29 is provided to receive defective IC sockets which are deflected toward chute 29 in a manner to be described.

The inspection system includes a laser 30, a collimator 31, and a lens 32 which produce a highly collimated and focused laser beam 40. The laser beam is split by beam splitter 41, and the split again by beam splitter 42. This results in three beams 51, 52, and 53, the beam 53 being reflected off directing mirror 45. The beams 52 and 53 are then reflected off mirrors 62 and 63 and directed toward photodetectors 92 and 93, respectively, via apertures 21 and 22 in track 15. The beams 52 and 53 are referred to as data beams. Aperture 21 is shown in dashed line since it is blocked by IC socket 13 being inspected. The beam 51 is reflected off directing mirrors 46 and 47 toward a beam splitter 48 and another directing mirror 49. This results in a pair of parallel beams 95 and 96 which traverse the track 15 one-above-another at a reference longitudinal position on the track 15 that corresponds to the positions at which beams 52 and 53 pass through the track. This position is referred to as the inspection position. The beams 95 and 96 which are respectively referred to as a pin gating beam and a housing gating beam, are received by photodetectors 105 and 106 on the opposite side of ramp 16. The outputs of photodetectors 92, 93, 105 and 106 are coupled to processing circuitry 200 which is operative to generate a control signal 200A. The control signal 200A is coupled to a solenoid 125 which, in turn, controls a source of compressed air 130 that is directed at a longitudinal position on track 15 that is just past the inspection position thereon.

Overall operation of the inspection system is as follows:

When an IC socket first enters the inspection position, housing gating beam 96 will be blocked by the socket housing, and will remain blocked until the part leaves the inspection position. Accordingly, the output of photodetector 106 going low is used as a master gating signal indicative of the part being at the inspection position. As each pin protruding from the IC socket at the inspection position passes the pin gating beam 95, the beam 95 is momentarily blocked, thereby generating a negative-going output pulse from photodetector 105. The output of photodetector 105 is therefore used as a pin gating signal; i.e., a signal which indicates that the data beams 52 and/or 53 are impinging on socket receptacles.

The output of photodetectors 92 and 93, which are indicative of the portion, if any, of the data beams 52 and 53 which pass through socket receptacles while the socket is at the inspection position, are, as previously stated, coupled to the processing electronics 200 along with the outputs of photodetectors 105 and 106. When the IC socket is at the inspection position (housing gating beam 96 blocked) and the pin gating beam is intercepted by a protruding pin, data beam 52 and/or 53 will be impinging on a receptacle in the socket housing. In this condition, a substantial output from photodetector 92 and/or 93 is indicative of a faulty condition, and this condition is detected by the processing circuitry 200.

Figure 3:
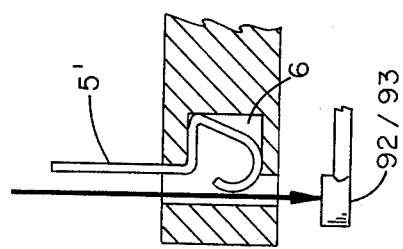
FIG. 3 illustrates a cross-section through a defectively mounted pin in an IC socket.
Figure 2:
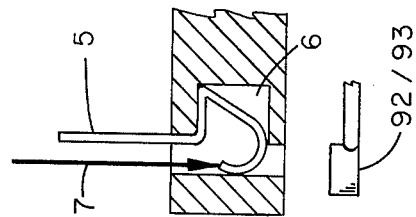
FIG. 2 illustrates a cross-section through a properly mounted pin in an IC socket.

To better understand the nature of a typical faulty condition, consider FIGS. 2 and 3 which respectively show a properly sprung pin 5 in its receptacle 6 and an improperly sprung pin 5' in receptacle 6. The properly sprung pin 5 substantially abuts the end walls of its receptacle so that little, if any, light from an inspecting light beam (e.g. beam 7 in FIG. 2) passes completely through the receptacle. However, in the case of improperly sprung pin 5', a space between the pin and the end wall of the receptacle allows a substantial amount of light to pass through. This light is automatically detected in the output of photodetectors 92 and/or 93 is processed to generate a signal which automatically rejects the defective part by deflecting it into reject chute 21.

Another type of defective condition is a missing pin. In this case, the data beams will operate in the same manner just described. However, if pins are missing at the same position of both rows, the data gating beam will not be intercepted. To avoid missing this kind of defect, the processing electronics contains a counter which counts the number of pins in the socket and causes a reject indication when the count is incorrect.

Figure 4:
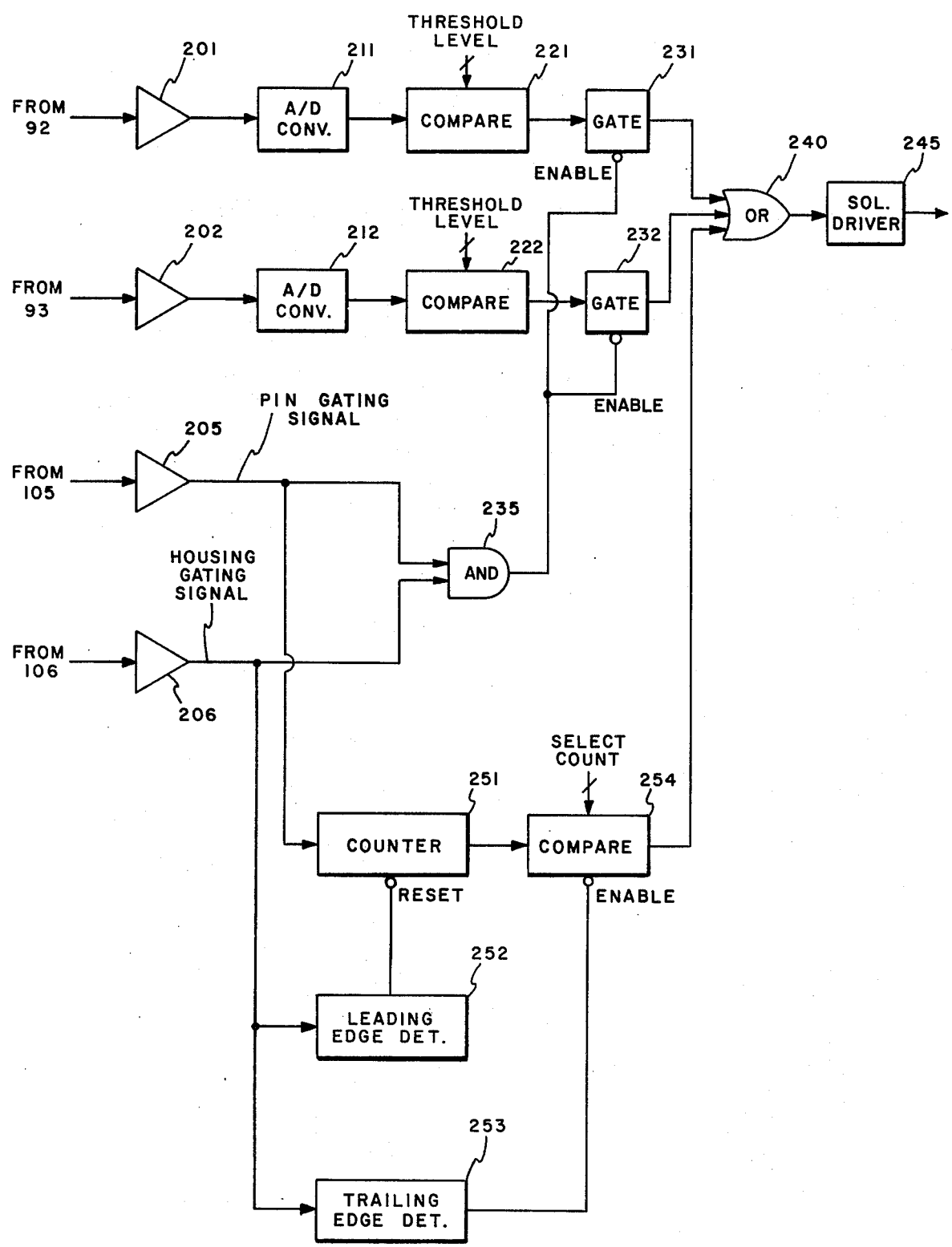
FIG. 4 is a block diagram of the processing electronics of the FIG. 1 embodiment.

Referring to FIG. 4 there is shown a block diagram of the processing circuitry 200 of FIG. 1. The outputs of photodetectors 92 and 93 are respectively coupled to amplifiers 201 and 202, which, in turn, are coupled to analog-to-digital converters 211 and 212. The analog-to-digital converters each generate an eight bit digital output which is representative of the analog amplitude of the input level to the respective digital-to-analog converter. The outputs of digital-to-analog converters 211 and 212 are respectively coupled to digital comparators 221 and 222. In manner well known in the art, the digital comparators are operative to compare the eight bit digital words which they receive at their inputs with a threshold digital level that is adjustable by the equipment operator. The outputs of comparators 221 and 222 are respectively coupled to gates 231 and 232. The gating input to gates 231 and 232 is the output of an AND gate 235. The AND gate 235, in turn, receives the outputs of the photodetectors 105 and 106, respectively, these signals being first amplified ans squared up by amplifiers 205 and 206. The outputs of gates 231 and 232 are coupled to OR gate 240 whose output is, in turn, coupled to solenoid driver 245. The output of solenoid driver 245 is the signal 200A which is coupled to the solenoid 125 (FIG. 1).

The output of amplifier 205, i.e., the data gating signal, is also coupled to a counter 251. The output of amplifier 206, i.e., the master gating signal, is also coupled to leading edge detector 252 and trailing edge detector 253. The output of leading edge detector 252 is coupled to the reset input of counter 251. The output of trailing edge detector 253 is coupled to the enable input of a comparator 254 which receives as one input the count from counter 251 and as another input an adjustable count which can be selected by the equipment operator. The output of comparator 254 is a further input to OR gate 240.

In operation, and consistent with the description of overall operation as described above, the data signal output of photodetectors 92 and 93 are compared, in digital form, with operator-selected threshold levels. When the threshold levels are exceeded, an output via gate 231 and 232 and OR gate 240 to solenoid driver 245 causes the part to be rejected. The gates 231 and 232 are controlled by the output of AND gate 235 which receives the housing gating signal and the pin gating signal, so that the data signals can only cause a reject indication when a socket is at the inspection position and pin receptacles are being impinged upon by the data beams. The counter 251 serves to count occurrences of pin gating beam, and thereby effectively counts the number of pins per socket. Each time a new socket enters the inspection position, the output of leading edge detector 252 resets the counter 251. When the socket leaves the inspection position, the output of trailing edge detector 253 enables comparator 254 to compare the count in counter 251 with an operator-selected count that corresponds to the number of pin receptacles in a row of the socket. If the counts do not correspond, the output of comparator 254 causes a reject indication via OR gate 240. It can be noted that if a pin is missing in only one row on the socket, the pin gating beam will be blocked the correct number of times and no output will be generated by comparator 254. In this case, however, the defective condition will be sensed, in the usual manner, via the data beams. Conversely, if pins are missing at corresponding positions in both rows of the socket, a defect indication will be generated due to operation of counter 251 and comparator 254.

Figure 6:
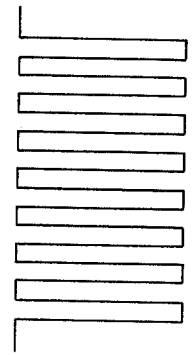
Figure 7:
Figure 8:
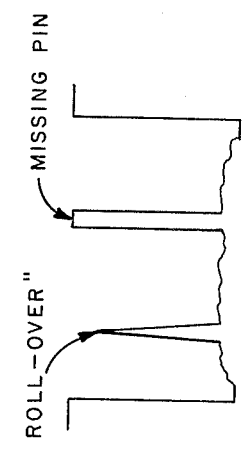

Referring to FIGS. 5-8, there are shown waveforms which illustrate operation of the circuitry of FIG. 4. FIG. 5 illustrates the housing gating signal which is output from the amplifier 206. FIG. 6 illustrates the pin gating signal which is the output of amplifier 205. The number of negative-going pulses in FIG. 6 corresponds to the number of pins in a socket. The waveform illustrated in FIG. 6 is of the type which will occur when all pins are present in both rows or where a pin is missing in one row but not at a corresponding position of the other row. FIG. 7 illustrates the output of amplifier 201 or 202 for an "acceptable" socket. It is seen that the data beam is generally blocked by the socket and that only a small amount of scattered light is received at the photodetectors 105 or 106. This signal (illustrated before digitization) is below the threshold level that is indicative of a reject. In FIG. 8 there is shown the type of signal which would be expected as an output from amplifier 201 or 202 when certain defective conditions are present. The first smaller peak represents an improperly sprung pin which results in a condition known as "pin roll-over". The substantial amount of light which passes through the receptacle in this condition is sufficient to cause the resultant photodetector output (after digitization) to exceed the threshold level of comparator 221 or 222. The second peak shows the output which would result from a missing pin, this condition again clearly causing an output of comparator 221 or 222.

The invention has been described with reference to a particular embodiment, but variations within the spirit and scope of the invention will occur to those skilled in the art. For example, while a particular socket configuration has been illustrated, it will be understood that the invention finds application in inspecting pin receptacles in other configurations.

We claim:

1. Apparatus for inspecting a hollow pin receptacle in a housing to determine whether or not a pin has been properly mounted in said receptacle, comprising:
   means for directing a collimated inspection light beam toward one surface of said housing so that said beam impinges on said receptacle;
   photodetector means disposed to face the opposing surface of said housing to receive light, if any, which has passed through said receptacle; and
   means responsive to said photodetector means for generating an output signal indicative of whether or not said pin has been properly mounted in said receptacle.

2. Apparatus as defined by claim 1 wherein said pin is normally mounted in said receptacle such that said pin protrudes from said housing, and further comprising means for directing a collimated pin gating light beam substantially parallel to and across a surface of said housing, second photodetector means disposed to receive said gating beam after it has traversed said housing, and means responsive to the output of said second photodetector means for generating a pin gating signal for gating said output signal generating means when said gating beam is intercepted by a protruding portion of said pin.

3. Apparatus as defined by claim 1 wherein said means responsive to the output of said photodetector means includes a threshold detector for detecting when the output of said photodetector means exceeds a predetermined threshold.

4. Apparatus as defined by claim 2 wherein said means responsive to the output of said photodetector means includes a threshold detector for detecting when the output of said photodetector means exceeds a predetermined threshold.

5. Apparatus as defined by claim 1 wherein said collimated light beam is a laser beam.

6. Apparatus as defined by claim 4 wherein said collimated light beam is a laser beam.

7. Apparatus for inspecting a row of hollow pin receptacles in housings passing an inspection position to determine whether or not pins have been properly mounted in the receptacles, comprising:
   means for directing a collimated inspection light beam toward one surface of a housing at the inspection position so that said light beam successively impinges on each of said receptacles as said housing moves through the inspection position;
   photodetector means disposed to face the opposing surface of said housing to receive light, if any, which has passed through said receptacles; and
   means responsive to said photodetector means for generating an output signal indicative of whether or not pins have been properly mounted in said receptacles.

8. Apparatus as defined by claim 7 further comprising:
   means for directing a collimated housing gating light beam toward the inspection position so that said a housing blocks said housing gating beam when a housing is at the inspection position;
   second photodetector means positioned to receive said housing gating beam when no housing is present at the inspection position; and
   means responsive to said second photodetector means for generating a housing gating signal for gating said output signal generating means when a housing is present at the inspection position.

9. Apparatus as defined by claim 7 wherein said pins are normally mounted in housing receptacles such that said pins protrude from said housings, and further comprising:

means for directing a collimated pin gating light beam at the inspection position, said pin gating beam being directed substantially parallel to the surface of said housings from which said pins protrude, such that the protruding portions of said pins successively block said pin gating beam as said inspection beam impinges on the receptacles of the pins blocking said pin gating beam;

third photodetector means positioned to receive said pin gating beam when it is not blocked by said pins; and means responsive to said third photodetector means for generating a pin gating signal for gating, said output signal generating means when a pin intercepts said pin gating beam.

10. Apparatus as defined by claim 8 wherein said pins are normally mounted in housing receptacles such that said pins protrude from said housings, and further comprising:

means for directing a collimated pin gating light beam at the inspection position, said pin gating beam being directed substantially parallel to the surface of said housings from which said pins protrude, such that the protruding portions of said pins successively block said pin gating beam as said inspection beam impinges on the receptacles of the pins blocking said pin gating beam;

third photodetector means positioned to receive said pin gating beam when it is not blocked by said pins; and means responsive to said third photodetector means for generating a pin gating signal for gating, said output signal generating means when a pin intercepts said pin gating beam.

11. Apparatus as defined by claim 9 further comprising pin counting means for counting occurrences of said pin gating signal which occur during said housing gating signal, and for generating an output indication when the count of occurrences of said pin gating signal does not correspond to a predetermined count.

12. Apparatus as defined by claim 10 further comprising pin counting means for counting occurrences of said pin gating signal which occur during said housing gating signal, and for generating an output indication when the count of occurrences of said pin gating signal does not correspond to a predetermined count.

13. In a system where integrated circuit socket housings are progressing along a surface of a track past an inspection position, an apparatus for inspecting parallel rows of hollow pin receptacles to determine whether or not pins have been properly mounted in the pin receptacles, comprising:

means for directing a plurality of collimated inspection light beams toward a housing at the inspection position so that said light beams successively impinge on each of said receptacles of the respective rows as said housing moves through the inspection position, said track having a plurality of apertures therein at the inspection position in the respective paths of said plurality of beams;

a plurality of photodetector means disposed to face the opposing surface of said track to receive light, if any, which has passed through said receptacles; and means responsive to said plurality of photodetector means for generating an output signal indicative of whether or not pins have been properly mounted in said receptacles.

14. Apparatus as defined by claim 13 further comprising:

means for directing a collimated housing gating light beam toward the inspection position so that said a housing blocks said housing gating beam when a housing is at the inspection position;

further photodetector means positioned to receive said housing gating beam when no housing is present at the inspection position; and means responsive to said further photodetector means for generating a housing gating signal for gating said output signal generating means when a housing is present at the inspection position.

15. Apparatus as defined by claim 13 wherein said pins are normally mounted in housing receptacles such that said pins protrude from said housings, and further comprising:

means for directing a collimated pin gating light beam at the inspection position, said pin gating beam being directed substantially parallel to the surface of said housings from which said pins protrude, such that the protruding portions of said pins successively block said pin gating beam as said inspection beam impinges on the receptacles of the pins blocking said pin gating beam;

additional photodetector means positioned to receive said pin gating beam when it is not blocked by said pins; and means responsive to said additional photodetector means for generating a pin gating signal for gating said output signal generating means when a pin intercepts said pin gating beam.

16. Apparatus as defined by claim 14 wherein said pins are normally mounted in housing receptacles such that said pins protrude from said housings, and further comprising:

means for directing a collimated pin gating light beam at the inspection position, said pin gating beam being directed substantially parallel to the surface of said housings from which said pins protrude, such that the protruding portions of said pins successively block said pin gating beam as said inspection beam impinges on the receptacles of the pins blocking said pin gating beam;

additional photodetector means positioned to receive said pin gating beam when it is not blocked by said pins; and means responsive to said additional photodetector means for generating a pin gating signal for gating said output signal generating means when a pin intercepts said pin gating beam.

17. Apparatus as defined by claim 15 further comprising pin counting means for counting occurrences of said pin gating signal which occur during said housing gating signal, and for generating an output indication when the count of occurrences of said pin gating signal does not correspond to a predetermined count.

18. Apparatus as defined by claim 16 further comprising pin counting means for counting occurrences of said pin gating signal which occur during said housing gating signal, and for generating an output indication when the count of occurrences of said pin gating signal does not correspond to a predetermined count.

19. A method for inspecting a row of hollow pin receptacles in housings passing an inspection position to determine whether or not pins have been properly mounted in the receptacles, comprising the steps of:

directing a collimated inspection light beam toward one surface of a housing at the inspection position so that said light beam successively impinges on each of said receptacles as said housing moves through the inspection position;

receiving light, if any, which has passed through said receptacles; and generating an output signal in response to the received light, said output signal being indicative of whether or not pins have been properly mounted in said receptacles.

20. A method as defined by claim 19 further comprising the steps of:

directing a collimated housing gating light beam toward the inspection position so that said a housing blocks said housing gating beam when a housing is at the inspection position;

receiving said housing gating beam when no housing is present at the inspection position; and generating a housing gating signal in response to the received housing gating beam for gating said output signal generation when a housing is present at the inspection position.

21. A method as defined by claim 19 wherein said pins are normally mounted in housing receptacles such that said pins protrude from said housings, and further comprising the steps of:

directing a collimated pin gating light beam at the inspection position, said pin gating beam being directed substantially parallel to the surface of said housings from which said pins protrude, such that the protruding portions of said pins successively block said pin gating beam as said inspection beam impinges on the receptacles of the pins blocking said pin gating beam;

receiving said pin gating beam when it is not blocked by said pins; and generating a pin gating signal in response to the received pin gating beam for gating said output signal generation when a pin intercepts said pin gating beam.

22. A method as defined by claim 20 wherein said pins are normally mounted in housing receptacles such that said pins protrude from said housings, and further comprising the steps of:

directing a collimated pin gating light beam at the inspection position, said pin gating beam being directed substantially parallel to the surface of said housings from which said pins protrude, such that the protruding portions of said pins successively block said pin gating beam as said inspection beam impinges on the receptacles of the pins blocking said pin gating beam;

receiving said pin gating beam when it is not blocked by said pins; and generating a pin gating signal in response to the received pin gating beam for gating said output signal generation when a pin intercepts said pin gating beam.

* * * * *